(12) United States Patent
Viniconis et al.

(10) Patent No.: US 10,670,646 B2
(45) Date of Patent: Jun. 2, 2020

(54) DETECTOR ASSEMBLY AND METHOD INCORPORATING ANGLED SENSORS

(71) Applicant: Arosa Group Ltd., Charlotte, NC (US)

(72) Inventors: Michael P. Viniconis, Charlotte, NC (US); Gulnoza Viniconis, Charlotte, NC (US)

(73) Assignee: Arosa Group Ltd., Charlotte, NC (US)

( * ) Notice: Subject to any disclaimer, the term of this patent is extended or adjusted under 35 U.S.C. 154(b) by 91 days.

(21) Appl. No.: 15/981,077

(22) Filed: May 16, 2018

(65) Prior Publication Data

US 2018/0335466 A1  Nov. 22, 2018

Related U.S. Application Data

(60) Provisional application No. 62/509,413, filed on May 22, 2017, provisional application No. 62/521,673, filed on Jun. 19, 2017.

(51) Int. Cl.

| | | |
|---|---|---|
| *G01R 31/12* | (2020.01) | |
| *G01J 3/02* | (2006.01) | |
| *G01J 5/04* | (2006.01) | |
| *G01J 1/02* | (2006.01) | |
| *G08B 17/12* | (2006.01) | |
| *G01D 11/24* | (2006.01) | |

(52) U.S. Cl.
CPC ........ *G01R 31/1218* (2013.01); *G01J 1/0271* (2013.01); *G01J 3/0291* (2013.01); *G01J 5/04* (2013.01); *G08B 17/12* (2013.01); *G01D 11/245* (2013.01)

(58) Field of Classification Search
None
See application file for complete search history.

(56) References Cited

U.S. PATENT DOCUMENTS

| | | | | |
|---|---|---|---|---|
| 2013/0234026 A1* | 9/2013 | Fujiwara | ............... | G01J 5/0225 250/338.3 |
| 2014/0103214 A1* | 4/2014 | Messiou | .............. | G08B 13/193 250/349 |

* cited by examiner

*Primary Examiner* — Jas A Sanghera
(74) *Attorney, Agent, or Firm* — Clements Bernard Walker; Christopher L. Bernard (57) ABSTRACT

The present invention relates to a detector assembly and method incorporating angled sensors, such that the area of coverage and detection sensitivity are maximized. The present invention finds particular applicability in the detection of sparks and the like in the presence of combustible gases, dusts, and the like via optical, infrared (IR), and ultraviolet (UV) methodologies and the like.

18 Claims, 8 Drawing Sheets

DETECTOR ASSEMBLY AND METHOD INCORPORATING ANGLED SENSORS

CROSS-REFERENCE TO RELATED APPLICATIONS

The present patent application/patent claims the benefit of priority of co-pending U.S. Provisional Patent Application No. 62/509,413, filed on May 22, 2017, and entitled "SPARK DETECTOR ASSEMBLY INCORPORATING ANGLED OPTICAL SENSORS," and U.S. Provisional Patent Application No. 62/521,673, filed on Jun. 19, 2017, and entitled "SPARK DETECTOR ASSEMBLY INCORPORATING ANGLED OPTICAL SENSORS," the contents of both of which are incorporated in full by reference herein.

FIELD OF THE INVENTION

The present invention relates generally to the safety and spark detection fields and the like. More specifically, the present invention relates to a detector assembly and method incorporating angled sensors, such that the area of coverage and detection sensitivity are maximized. The present invention finds particular applicability in the detection of sparks and the like in the presence of combustible gases, dusts, and the like via optical, infrared (IR), and ultraviolet (UV) methodologies and the like.

BACKGROUND OF THE INVENTION

Spark detectors are commonly used in industries that must deal with combustible gases, dusts, and the like. If a spark from any source is rapidly detected in such media, appropriate extinguishing and mitigating measures can be immediately implemented, thereby minimizing the potential for dangerous and costly explosion and fire. Such spark detectors typically incorporate one or more sensors disposed on a planar surface such that the one or more sensors have some degree of visibility into the media. However, it is continually desirable to have spark detectors that have better area of coverage and greater sensitivity, such that fewer and more effective spark detectors may be utilized. Most conventional spark detectors utilize substantially "flat" sensor arrays, limiting their area of coverage and sensitivity. As a result, numerous spark detectors must be placed in an environment for effective spark detection. This is an inefficient situation, both from a safety standpoint and an economic standpoint. Thus, what are still needed in the art are improved detector assemblies and methods that provide enhanced area of coverage and detection sensitivity.

BRIEF SUMMARY OF THE INVENTION

In various exemplary embodiments, the present invention provides detector assemblies and methods incorporating angled sensors, such that the area of coverage and detection sensitivity are maximized. The present invention finds particular applicability in the detection of sparks and the like in the presence of combustible gases, dusts, and the like via optical, IR, and UV methodologies and the like.

In one exemplary embodiment, the present invention provides a detector assembly, including: a housing; one or more sensor support structures one or more of coupled to and defined by the housing; and a plurality of sensors coupled to the one or more sensor support structures, wherein each of the plurality of sensors is operable for detecting a spark or the like, and wherein at least one of the plurality of sensors is disposed in a different angled orientation relative to a planar front surface defined by the housing with respect to at least one other of the plurality of sensors. Each of the plurality of sensors includes one or more of a visible radiation sensor, a infrared (IR) radiation sensor, and an ultraviolet (UV) radiation sensor. Preferably, the one or more sensor support structures are disposed within an interior space defined by the housing. Optionally, each of the one or more sensor support structures includes a support surface defined by an interior surface of the housing. Alternatively, each of the one or more sensor support structures includes a support surface coupled to an interior surface of the housing. Optionally, one or more of the plurality of sensors are disposed substantially parallel to the planar front surface defined by the housing. Optionally, one or more of the plurality of sensors are disposed at an acute angle relative to the planar front surface defined by the housing and face generally towards an exterior side portion of the housing. Alternatively, one or more of the plurality of sensors are disposed at an acute angle relative to the planar front surface defined by the housing and face generally towards an interior middle portion of the housing. Optionally, two or more of the plurality of sensors are angled generally away from one another towards an exterior side portion of the housing in a substantially convex sensor configuration. Alternatively, two or more of the plurality of sensors are angled generally towards one another towards an interior middle portion of the housing in a substantially concave sensor configuration.

In another exemplary embodiment, the present invention provides a detector method, including: providing a housing; providing one or more sensor support structures one or more of coupled to and defined by the housing; and providing a plurality of sensors coupled to the one or more sensor support structures, wherein each of the plurality of sensors is operable for detecting a spark or the like, and wherein at least one of the plurality of sensors is disposed in a different angled orientation relative to a planar front surface defined by the housing with respect to at least one other of the plurality of sensors. Each of the plurality of sensors includes one or more of a visible radiation sensor, a infrared (IR) radiation sensor, and an ultraviolet (UV) radiation sensor. Preferably, the one or more sensor support structures are disposed within an interior space defined by the housing. Optionally, each of the one or more sensor support structures includes a support surface defined by an interior surface of the housing. Alternatively, each of the one or more sensor support structures includes a support surface coupled to an interior surface of the housing. Optionally, one or more of the plurality of sensors are disposed substantially parallel to the planar front surface defined by the housing. Optionally, one or more of the plurality of sensors are disposed at an acute angle relative to the planar front surface defined by the housing and face generally towards an exterior side portion of the housing. Alternatively, one or more of the plurality of sensors are disposed at an acute angle relative to the planar front surface defined by the housing and face generally towards an interior middle portion of the housing. Optionally, two or more of the plurality of sensors are angled generally away from one another towards an exterior side portion of the housing in a substantially convex sensor configuration. Alternatively, two or more of the plurality of sensors are angled generally towards one another towards an interior middle portion of the housing in a substantially concave sensor configuration.

BRIEF DESCRIPTION OF THE DRAWINGS

The present invention is illustrated and described herein with reference to the various drawings, in which like reference numbers are used to denote like assembly components/ method steps, as appropriate, and in which.

DETAILED DESCRIPTION OF THE INVENTION

Again, in various exemplary embodiments, the present invention provides detector assemblies and methods incorporating angled sensors, such that the area of coverage and detection sensitivity are maximized. The present invention finds particular applicability in the detection of sparks and the like in the presence of combustible gases, dusts, and the like via optical, IR, and UV methodologies and the like.

Referring now specifically to FIGS. 1-6, in one exemplary embodiment, the detector assembly 10 of the present invention includes a housing 12, such as a substantially circular housing, a substantially square housing, or the like, that is configured to be coupled to a surface, an assembly, a tube holder, or the like (not illustrated) and disposed in an environment potentially in the presence of a combustible gas, dust, or the like, such as in a room, storage container, duct, or the like (not illustrated). This housing 12 may be manufactured from a metallic material, a plastic material, and/or the like and it may be environmentally sealed, if appropriate. Preferably, when used, a protective front surface 14 of the housing 12 is transparent to radiation, such as visible radiation, IR radition, UV radiation, and/or the like.

Thus, the housing 12 represents a (sealed) deployable unit that may be selectively disposed in an environment to be monitored by sensors disposed within and interior of (or attached to an exterior of) the housing 12. It is often desirable that the housing 12 is molded and corrosion resistant. Preferably, one or more attachment mechanisms 13 are provided for selectively attaching the housing 12 to one or more of a surface, another assembly, a pipe, etc.— anywhere that it is desirable to dispose the detector assembly 10. Such attachment mechanisms 13 are varied and are well known to those of ordinary skill in the art.

One or more sensor support structures 16 are manufactured within or attached to the housing 12 and configured to hold the plurality of sensor assemblies 18 described in greater detail herein below. Each of these sensor support structures 16 may consist of a simple platform or ramp structure defined by a housing surface, a more complex, attachment structure defined by the housing surface, and/or a separate assembly (one-piece or multi-piece) that is otherwise coupled to the housing surface. In the exemplary embodiment illustrated, the sensor support structures 16 include a substantially "flat" structure or attachment point 20 that holds the associated sensor assembly 18 substantially parallel to the protective front surface 14 of the housing 12. The sensor support structures 16 also include a plurality of substantially angled ramp structures or attachment points 22 that hold the associated sensor assemblies 18 at a substantially acute angle to the protective front surface 14 of the housing 12, generally facing away from each other and towards the exterior of the housing 12. This forms a generally convex sensor configuration. It will be readily apparent to those of ordinary skill in the art that other numbers of sensor assemblies 18, configurations, and orientations may be used equally. In this exemplary embodiment, one "flat" sensor assembly 18 and two opposed "outwards angled" sensor assemblies 18 provide the desired area of coverage and sensitivity, covering the environment in front of and to the left and right periphery of the detector assembly 10.

Each of the sensor assemblies 18 includes one or more sensors 24, such as one or more photodetectors, photodiodes, IR sensors, UV sensors, or the like, disposed on a surface thereof, preferably facing towards the combustible medium in which they are configured to detect a spark or the like. As is well known to those of ordinary skill in the art, each of these sensor assemblies 18 typically includes one or more sensors 24 disposed on a printed circuit board (PCB) or the like. In this exemplary embodiment, pairs of sensors 24 are utilized, however, single or multiple sensors 24 can be utilized equally with respect to each sensor assembly 18.

Finally, a control board (not illustrated) and/or power supply (not illustrated) can be provided within the housing 12, or the housing 12 can be coupled to an external control board (not illustrated) and/or power supply (not illustrated). Any number of other components required for spark detection or the like can be utilized as well.

Figure 1:
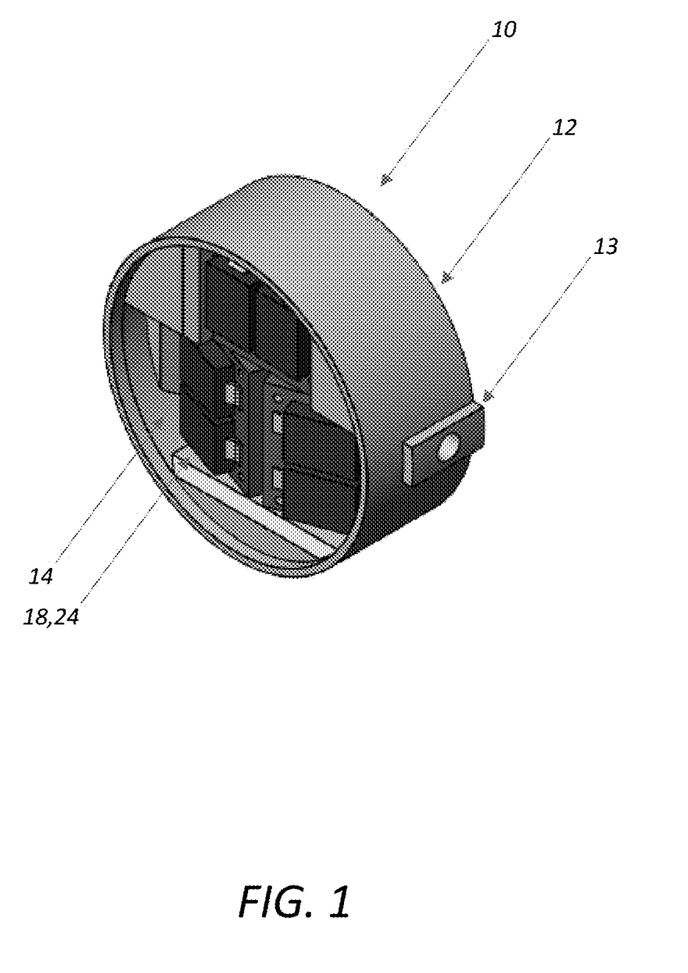
FIG. 1 is a perspective view of one exemplary embodiment of the detector assembly of the present invention, incorporating a plurality of planar sensors and a plurality of angled sensors in a substantially convex sensor configuration.
Figure 2:
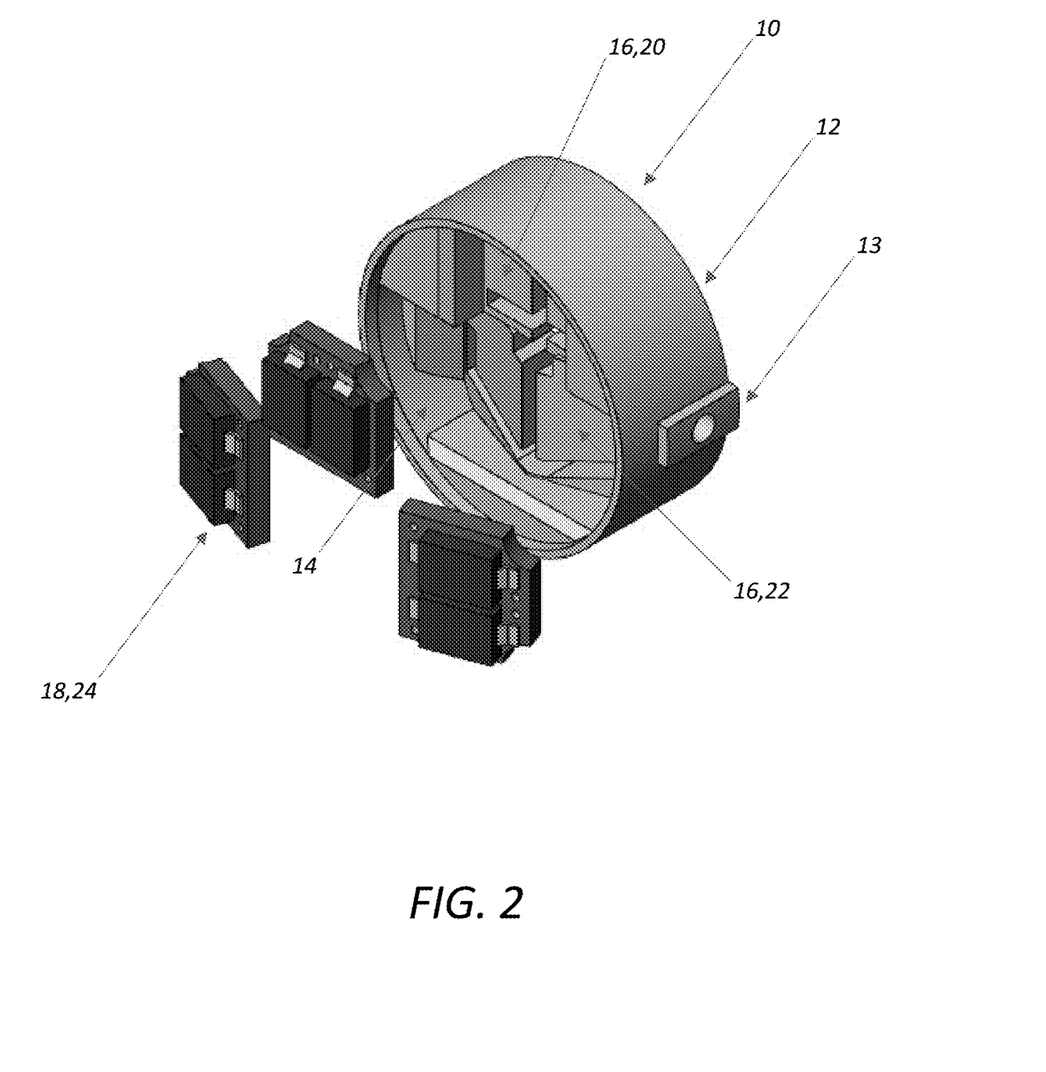
FIG. 2 is an exploded perspective view of one exemplary embodiment of the detector assembly of the present invention, incorporating a plurality of planar sensors and a plurality of angled sensors in a substantially convex sensor configuration.
Figure 3:
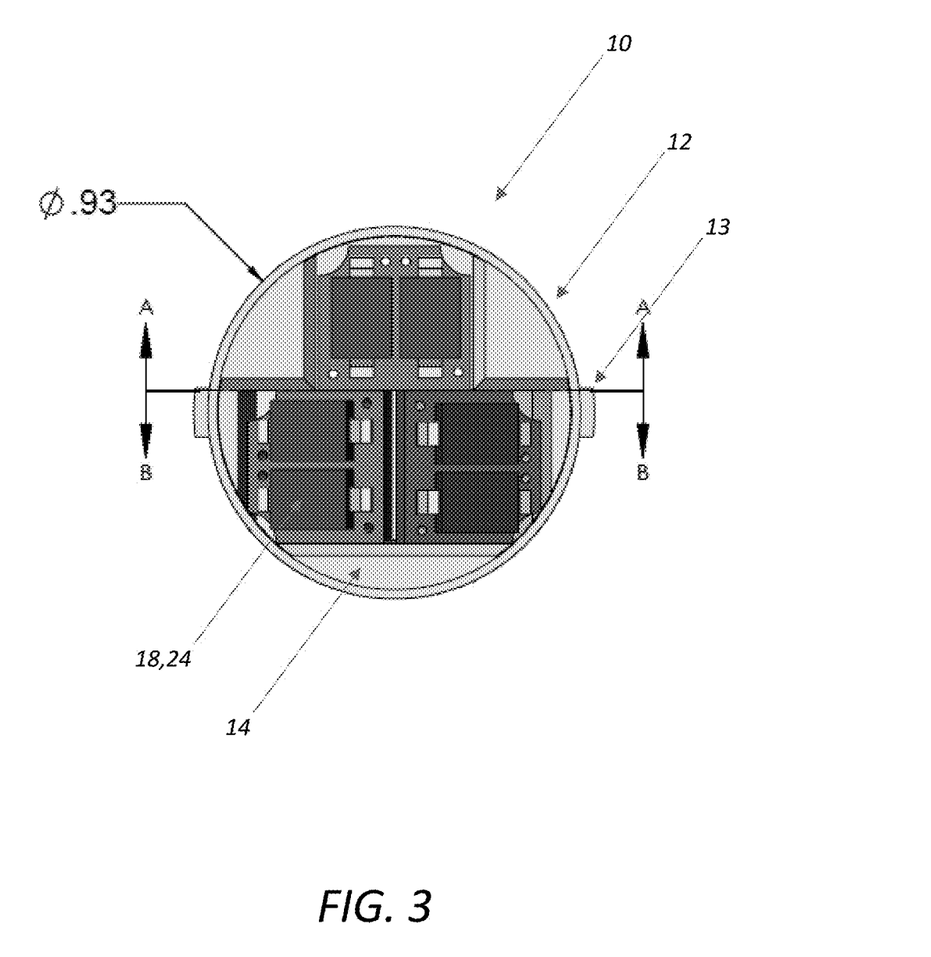
FIG. 3 is a front planar view of one exemplary embodiment of the detector assembly of the present invention, incorporating a plurality of planar sensors and a plurality of angled sensors in a substantially convex sensor configuration.
Figure 4:
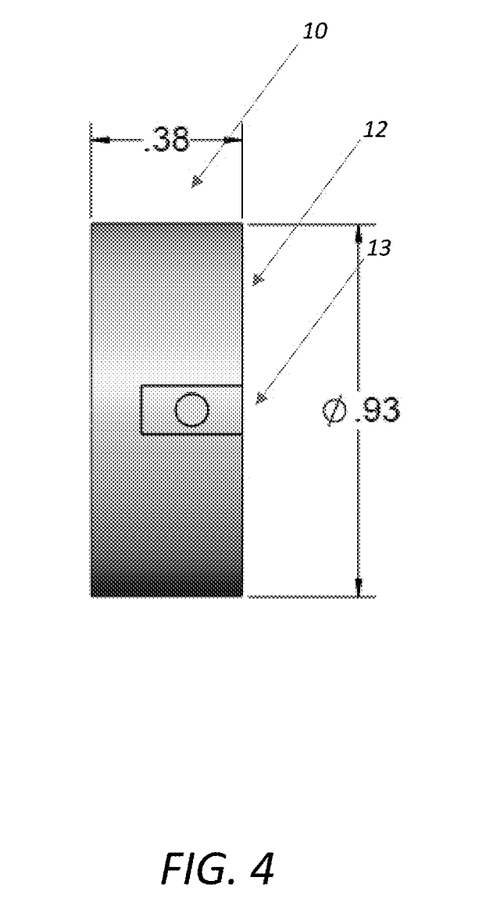
FIG. 4 is a side planar view of one exemplary embodiment of the detector assembly of the present invention, incorporating a plurality of planar sensors and a plurality of angled sensors in a substantially convex sensor configuration.
Figure 5:
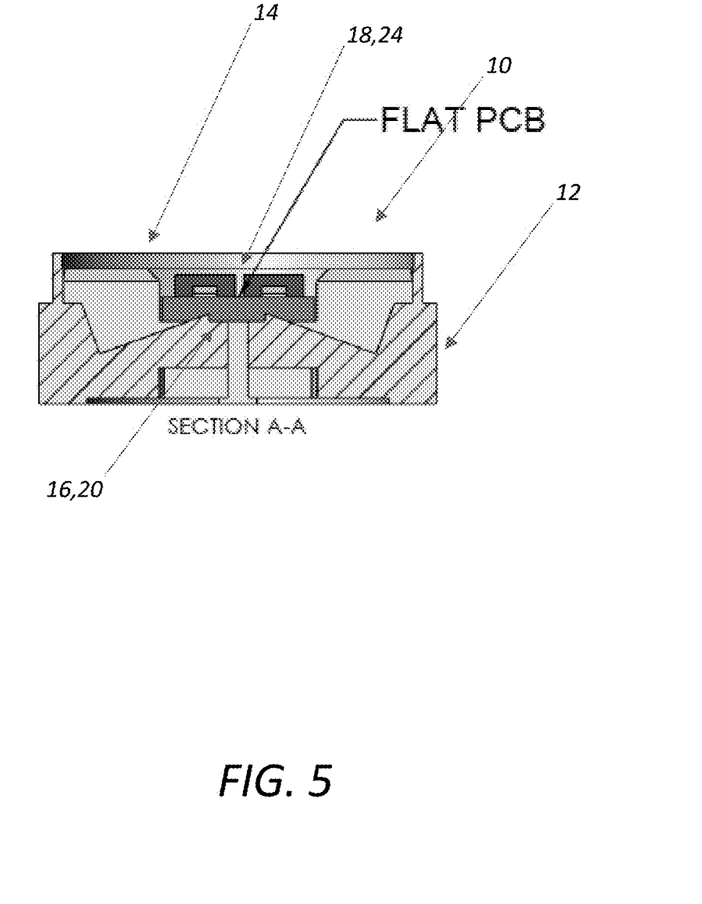
FIG. 5 is a cross-sectional side view of one exemplary embodiment of the detector assembly of the present invention, incorporating a plurality of planar sensors and a plurality of angled sensors in a substantially convex sensor configuration, highlighting the orientation of the plurality of planar sensors.
Figure 6:
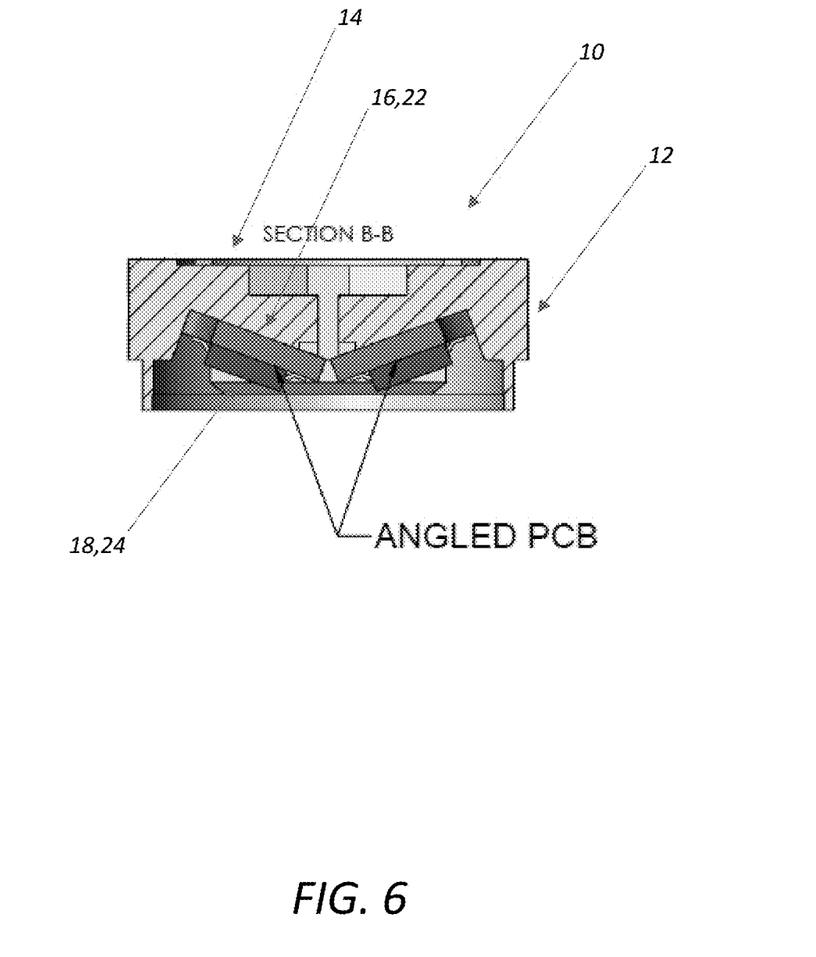
FIG. 6 is a cross-sectional side view of one exemplary embodiment of the detector assembly of the present invention, incorporating a plurality of planar sensors and a plurality of angled sensors in a substantially convex sensor configuration, highlighting the orientation of the plurality of angled sensors.
Figure 7:
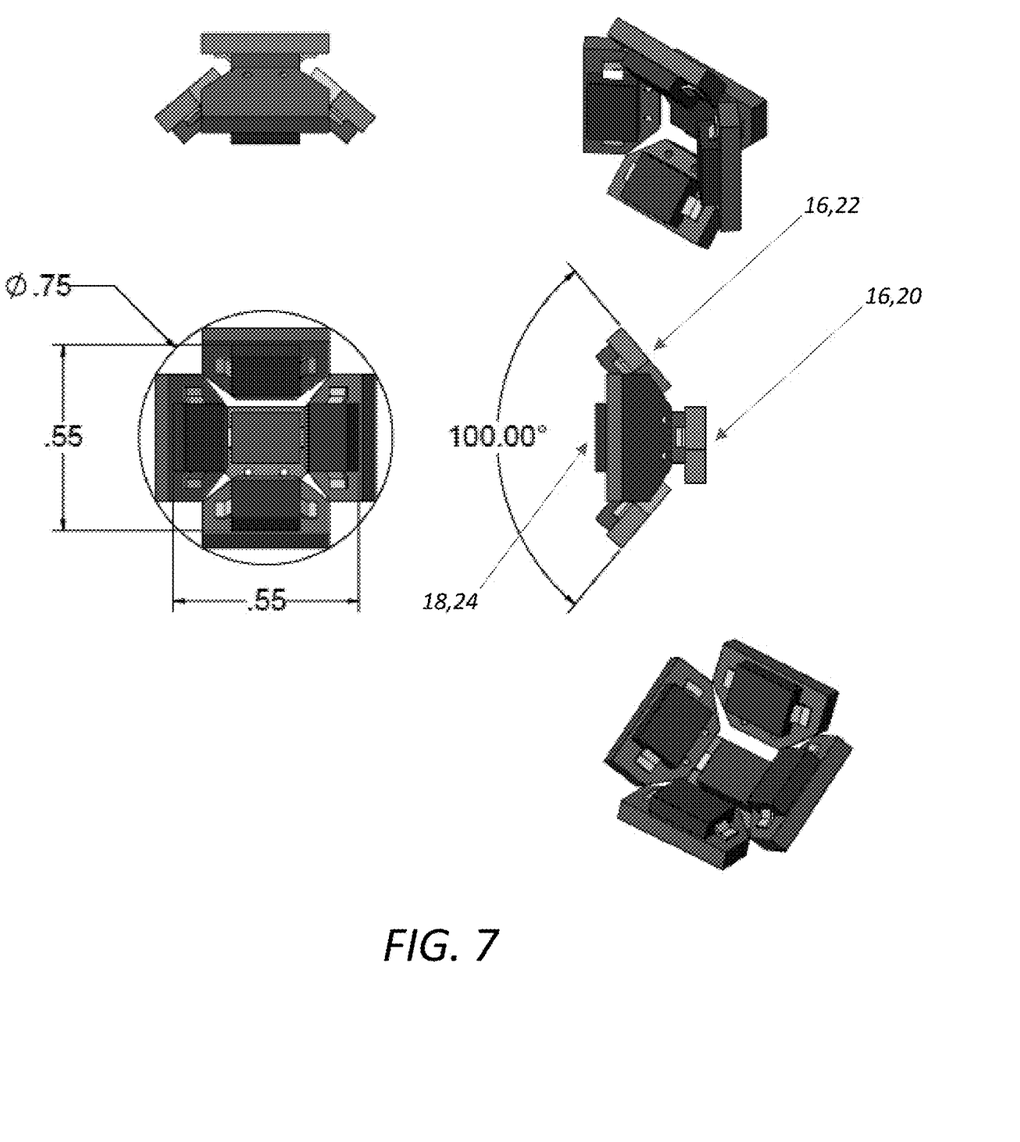
FIG. 7 is a series of planar and perspective views of another exemplary embodiment of the detector assembly of the present invention, incorporating one or more planar sensors and a plurality of angled sensors in a substantially concave sensor configuration.

Referring now specifically to FIG. 7, in another exemplary embodiment, the detector assembly 10 (FIGS. 1-6) of the present invention again includes a housing 12 (FIGS. 1-6), such as a substantially circular housing, a substantially square housing, or the like, that is configured to be coupled to a surface, an assembly, a tube holder, or the like (not illustrated) and disposed in an environment potentially in the presence of a combustible gas, dust, or the like, such as in a room, storage container, duct, or the like (not illustrated). This housing 12 may be manufactured from a metallic material, a plastic material, and/or the like and it may be environmentally sealed, if appropriate. Preferably, when used, a protective front surface 14 (FIGS. 1-6) of the housing 12 is transparent to radiation, such as visible radiation, IR radtion, UV radiation, and/or the like. Thus, the housing 12 represents a (sealed) deployable unit that may be selectively disposed in an environment to be monitored by sensors disposed within and interior of (or attached to an exterior of) the housing 12. It is often desirable that the housing 12 is molded and corrosion resistant. Preferably, one or more attachment mechanisms 13 (FIGS. 1-6) are provided for selectively attaching the housing 12 to one or more of a surface, another assembly, a pipe, etc.—anywhere that it is desirable to dispose the detector assembly 10. Such attachment mechanisms 13 are varied and are well known to those of ordinary skill in the art.

One or more sensor support structures 16 are again manufactured within or attached to the housing 12 and configured to hold the plurality of sensor assemblies 18 described in greater detail herein below. Each of these sensor support structures 16 may consist of a simple platform or ramp structure defined by a housing surface, a more complex, attachment structure defined by the housing surface, and/or a separate assembly (one-piece or multi-piece) that is otherwise coupled to the housing surface. In the exemplary embodiment illustrated, the sensor support structures 16 include a substantially "flat" structure or attachment point 20 that holds the associated sensor assembly 18 substantially parallel to the protective front surface 14 of the housing 12. The sensor support structures 16 also include a plurality of substantially angled ramp structures or attachment points 22 that hold the associated sensor assemblies 18 at a substantially acute angle to the protective front surface 14 of the housing 12, generally facing towards each other and towards the interior of the housing 12. This forms a generally concave sensor configuration. It will be readily apparent to those of ordinary skill in the art that other numbers of sensor assemblies 18, configurations, and orientations may be used equally. In this exemplary embodiment, one "flat" sensor assembly 18 and four opposed "inwards angled" sensor assemblies 18 provide the desired area of coverage and sensitivity, covering the environment in front of, to the left and right periphery of, and above and below the detector assembly 10.

Again, each of the sensor assemblies 18 includes one or more sensors 24, such as one or more photodetectors, photodiodes, IR sensors, UV sensors, or the like, disposed on a surface thereof, preferably facing towards the combustible medium in which they are configured to detect a spark or the like. As is well known to those of ordinary skill in the art, each of these sensor assemblies 18 typically includes one or more sensors 24 disposed on a PCB or the like. In this exemplary embodiment, single sensors 24 are utilized, however, multiple sensors 24 can be utilized equally with respect to each sensor assembly 18.

Finally, a control board (not illustrated) and/or power supply (not illustrated) can again be provided within the housing 12, or the housing 12 can be coupled to an external control board (not illustrated) and/or power supply (not illustrated). Any number of other components required for spark detection or the like can be utilized as well.

Figure 8:
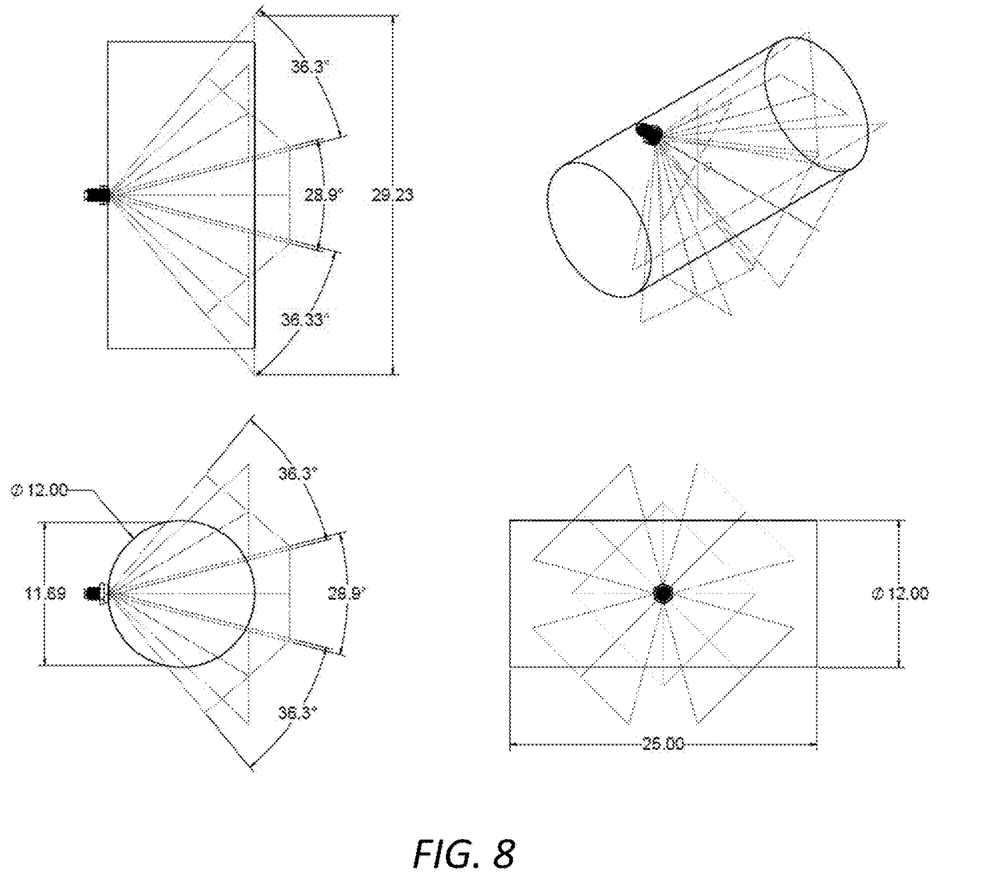
FIG. 8 is a series of schematic views illustrating an exemplary "field of view" of the detector assembly of FIG. 7 disposed within a monitored conduit system.

FIG. 8 is a series of schematic views illustrating an exemplary "field of view" of the detector assembly of FIG. 7 disposed within a monitored conduit system.

Thus, in accordance with the present invention, one or more sensors are disposed in a planar front-facing orientation within and/or coupled to the housing and one or more sensors are disposed in an angled orientation within and/or coupled to the housing. This provides enhanced collective angular coverage of the plurality of sensors and increases their effective sensitivity. Any number of sensors (greater than one) can be utilized at any angles, provided that at least two of the optical sensors are disposed at different angles. For example, in the first exemplary embodiment illustrated, a pair of flat sensors are provided near the top of the housing, with two opposed pairs of sensors disposed below. This arrangement provides greater sensor visibility forward, left, and right with respect to the housing. Generally upward, downward, and inward-facing pairs of sensors can also be utilized. The various orientations and angles are dictated by suitable planar structures manufactured within the housing on which the sensors are disposed. An additive manufacturing process or the like can be used for this purpose, for example. In one possible alternative embodiment, the planar structures within the housing may form a truncated pyramid structure, with optical sensors coupled to the flat top and four opposed sloping sides of the truncated pyramid structure.

Although the present invention is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following non-limiting claims for all purposes.

What is claimed is:

1. A detector assembly, comprising:
   a housing;
   one or more sensor support structures one or more of coupled to and defined by the housing;
   a plurality of sensors coupled to the one or more sensor support structures, wherein each of the plurality of sensors is operable for detecting a spark, and wherein at least one of the plurality of sensors is disposed in a different angled orientation relative to a planar front surface defined by the housing with respect to at least one other of the plurality of sensors; and
   a planar protective front surface disposed coincident with the planar front surface defined by the housing and enclosing all of the plurality of sensors within the housing, wherein at least one of the plurality of sensors is disposed parallel to the planar protective front surface and one or more of the plurality of sensors are disposed at an acute angle relative to the planar protective front surface.

2. The detector assembly of claim 1, wherein each of the plurality of sensors comprises one or more of a visible radiation sensor, an infrared (IR) radiation sensor, and an ultraviolet (UV) radiation sensor.

3. The detector assembly of claim 1, wherein the one or more sensor support structures are disposed within an interior space defined by the housing.

4. The detector assembly of claim 1, wherein each of the one or more sensor support structures comprises a support surface defined by an interior surface of the housing.

5. The detector assembly of claim 1, wherein each of the one or more sensor support structures comprises a support surface coupled to an interior surface of the housing.

6. The detector assembly of claim 1, wherein the one or more of the plurality of sensors disposed at the acute angle relative to the planar protective front surface face generally towards an exterior side portion of the housing.

7. The detector assembly of claim 1, wherein the one or more of the plurality of sensors disposed at the acute angle relative to the planar protective front surface face generally towards an interior middle portion of the housing.

8. The detector assembly of claim 1, wherein two or more of the plurality of sensors are angled generally away from one another towards an exterior side portion of the housing in a substantially convex sensor configuration.

9. The detector assembly of claim 1, wherein two or more of the plurality of sensors are angled generally towards one another towards an interior middle portion of the housing in a substantially concave sensor configuration.

10. A detector method, comprising:
providing a housing;
providing one or more sensor support structures one or more of coupled to and defined by the housing;
providing a plurality of sensors coupled to the one or more sensor support structures, wherein each of the plurality of sensors is operable for detecting a spark, and wherein at least one of the plurality of sensors is disposed in a different angled orientation relative to a planar front surface defined by the housing with respect to at least one other of the plurality of sensors; and
providing a planar protective front surface disposed coincident with the planar front surface defined by the housing and enclosing all of the plurality of sensors within the housing, wherein at least one of the plurality of sensors is disposed parallel to the planar protective front surface and one or more of the plurality of sensors are disposed at an acute angle relative to the planar protective front surface.

11. The detector method of claim 10, wherein each of the plurality of sensors comprises one or more of a visible radiation sensor, an infrared (IR) radiation sensor, and an ultraviolet (UV) radiation sensor.

12. The detector method of claim 10, wherein the one or more sensor support structures are disposed within an interior space defined by the housing.

13. The detector method of claim 10, wherein each of the one or more sensor support structures comprises a support surface defined by an interior surface of the housing.

14. The detector method of claim 10, wherein each of the one or more sensor support structures comprises a support surface coupled to an interior surface of the housing.

15. The detector method of claim 10, wherein the one or more of the plurality of sensors disposed at the acute angle relative to the planar protective front surface face generally towards an exterior side portion of the housing.

16. The detector method of claim 10, wherein the one or more of the plurality of sensors disposed at the acute angle relative to the planar protective front surface face generally towards an interior middle portion of the housing.

17. The detector method of claim 10, wherein two or more of the plurality of sensors are angled generally away from one another towards an exterior side portion of the housing in a substantially convex sensor configuration.

18. The detector method of claim 10, wherein two or more of the plurality of sensors are angled generally towards one another towards an interior middle portion of the housing in a substantially concave sensor configuration.

* * * * *